US011528022B2

United States Patent
Mikhael et al.

(10) Patent No.: US 11,528,022 B2
(45) Date of Patent: Dec. 13, 2022

(54) LEAKAGE-CURRENT COMPENSATION

(71) Applicant: SOCIONEXT INC., Kanagawa (JP)

(72) Inventors: David Hany Gaied Mikhael, Langen (DE); Bernd Hans Germann, Langen (DE); Ricardo Doldan Lorenzo, Langen (DE)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 17/370,453

(22) Filed: Jul. 8, 2021

(65) Prior Publication Data

US 2022/0038090 A1    Feb. 3, 2022

(30) Foreign Application Priority Data

Jul. 30, 2020 (EP) .................................... 20188774

(51) Int. Cl.
*H03K 17/16* (2006.01)
*G05F 1/46* (2006.01)

(52) U.S. Cl.
CPC ............. *H03K 17/161* (2013.01); *G05F 1/46* (2013.01)

(58) Field of Classification Search
None
See application file for complete search history.

(56) References Cited

U.S. PATENT DOCUMENTS

| | | |
|---|---|---|
| 6,744,303 B1 | 6/2004 | Maley |
| 9,455,723 B2 * | 9/2016 | Vahid Far ............. H03L 7/0802 |
| 2002/0121939 A1 | 9/2002 | Vanselow et al. |
| 2005/0156655 A1 | 7/2005 | Boerstler et al. |
| 2005/0168292 A1 | 8/2005 | Frans et al. |
| 2013/0229213 A1 | 9/2013 | Park et al. |
| 2014/0118034 A1 | 5/2014 | Lemkin et al. |

FOREIGN PATENT DOCUMENTS

| | | |
|---|---|---|
| CN | 101025638 A | 8/2007 |
| WO | 03/100980 A1 | 12/2003 |

OTHER PUBLICATIONS

Extended European Search Report issued in European Patent Application No. 20188774.2, dated Jan. 15, 2021.

* cited by examiner

*Primary Examiner* — Thomas J. Hiltunen
(74) *Attorney, Agent, or Firm* — McDermott Will & Emery LLP (57) ABSTRACT

A leakage-current compensation circuit including: a first node for connection of a first component, a first leakage current flows through the first component and node with a given polarity, the magnitude of the first leakage current dependent on a first potential difference across the first component; a second component connected to a second node with a second leakage current flowing through the second component and node, the magnitude of the second leakage current dependent on a second potential difference across the second component; a current mirror connected to the first and second nodes to cause a compensation current, the magnitude of the compensation current dependent on the magnitude of the second leakage current; a differential amplifier connected in series with the second component along a current path carrying the second leakage current; and an AC coupling superimposing an AC-component of the first potential difference on the second potential difference.

16 Claims, 9 Drawing Sheets

LEAKAGE-CURRENT COMPENSATION

CROSS-REFERENCE OF RELATED APPLICATIONS

This application claims the benefit of European Patent Application No. 20188774.2, filed on Jul. 30, 2020, the entire disclosure of which Application is incorporated by reference herein.

The present invention relates to leakage-current compensation, in particular to circuits for compensating for leakage currents or in which such leakage currents are substantially compensated for.

MOS (metal oxide semiconductor) devices suffer from gate leakage due to a gate-tunneling effect. Example such devices include a MOSFET ((metal-oxide-semiconductor field-effect transistor), a MOS capacitor and a MOS varactor.

As technology scales downwardly in size, gate thicknesses get thinner, which results in an increased gate-tunneling effect, and, consequently, more leakage current. FinFET (fin field-effect transistor) technologies are particularly vulnerable because the gate surrounds the channel on three sides, compared to on one side for conventional bulk-CMOS technologies.

The gate leakage is temperature and voltage dependent and can be relatively high at high temperatures and gate voltages, especially for newer technologies where the gate thickness is smaller. The leakage current can limit the overall circuit performance where, for example, MOS devices are used as capacitors in PLL (phase-locked loop) loop filters, RC-filters, VCO (voltage-controlled oscillator) tuning varactors, capacitor banks, and many other applications.

Leakage-current compensation circuits have been previously considered, but are considered to have performance shortcomings, for example in terms of their accuracy and/or suitability for use with new technologies where available voltage headroom is limited.

It is desirable to provide improved leakage-current compensation circuits which can compensate for such leakage currents in an improved manner compared to previously-considered leakage-current compensation circuits. It is desirable to provide circuits comprising such improved leakage-current compensation circuits which thus have improved performance.

According to an embodiment of a first aspect of the present invention there is provided a leakage-current compensation circuit, comprising: a first node for connection of a first component thereto, whereby a first leakage current flows through the first component and through the first node with a given polarity with respect to the first node, the magnitude of the first leakage current dependent on a first potential difference across the first component; a second component connected to a second node and configured such that a second leakage current flows through the second component and through the second node, the magnitude of the second leakage current dependent on a second potential difference across the second component; a current mirror connected to the first node and the second node and configured to cause a compensation current to flow through the first node with opposite polarity to the first leakage current with respect to the first node, the magnitude of the compensation current dependent on the magnitude of the second leakage current due to current mirroring; a differential amplifier configured, based on a difference between the first potential difference and the second potential difference, to control a feedback component connected in series with the second component along a current path carrying the second leakage current to cause the second potential difference to track the first potential difference; and an AC coupling connected to superimpose an AC-component of the first potential difference on the second potential difference.

In this way, the second potential difference may track the first potential difference in both AC and DC terms, or over a larger bandwidth than if the AC coupling were not provided. This may enable the compensation current to at least partially cancel out the first leakage current at the first node with improved accuracy as compared to if the AC coupling were not provided.

The second potential difference may be considered to track the first potential difference in that it follows or tends to be substantially the same as, or proportional to or offset from the first potential difference.

A further current path or connection may be made to the first node so that when the compensation current is the same as the first leakage current effectively the first leakage current has no effect on current flowing in that further current path (so that potentially no current flows in that further current path, at least in DC terms).

The leakage-current compensation circuit may comprise the first component connected to the first node. The leakage-current compensation circuit may be provided without the first component or the second component, for connection of the first and second components thereto.

The second component may be configured such that, when the first potential difference is the same as the second potential difference, the first leakage current and the second leakage current have a defined relationship. The defined relationship may be a proportional relationship. When the first potential difference is the same as the second potential difference, a ratio between the second leakage current and the first leakage current may be substantially constant.

The first and second components may be leaky or leakage components. The second component may be scaled in size and/or dimensions relative to the first component. The first and second components may each comprise a field-effect transistor, and/or a MOS device such as a MOSFET. The first component may be a target component and the second component may be a replica component being a replica of the target component. The second component may be a scaled version of the first component. The first and second components may both comprise varactors such as MOS varactors or capacitors such as MOS capacitors. The second component may be configured differently from the first component, optionally wherein the first component comprises a varactor such as a MOS varactor and the second component comprises a diode-connected transistor such as a MOSFET in series with a resistor.

The first and second components may be scaled relative to one another, so that when the first and second potential differences are the same as one another, the first and second leakage currents are scaled relative to one another in the same way.

The differential amplifier may be configured to control the feedback component to cause the second potential difference to track the first potential difference over a control-loop frequency bandwidth limited at least in part by the differential amplifier. The AC coupling may be configured to superimpose the AC-component of the first potential difference on the second potential difference so that the second potential difference tracks the first potential difference over an extended frequency bandwidth larger than said control-loop frequency bandwidth. The second leakage current may be substantially proportional to the first leakage current.

The current mirror may be configured such that the magnitudes of the compensation current and the second leakage current are substantially proportional to one another. The current mirror may be configured such that the compensation current at least partially, or substantially, cancels the first leakage current at the first node. The current mirror may be configured such that a ratio between the compensation current and the second leakage current is the inverse of: a ratio between the second leakage current and the first leakage current; and/or a ratio between the size and/or dimensions of the second component and the first component.

The current mirror may comprise a first transistor (whose channel is) connected along a current path carrying the compensation current and a second transistor (whose channel is) connected along the current path carrying the second leakage current. A ratio in the size and/or dimensions of the first transistor to the second transistor may be the inverse of a ratio in the size and/or dimensions of the second component to the first component.

The differential amplifier may be configured to control the gate voltages of the first and second transistors. The feedback component may comprise the second transistor or a further transistor (whose channel is) connected in series with (the channel of) the second transistor.

The first transistor may be implemented as a plurality of transistors (whose channels are) connected together in parallel. The second transistor may be implemented as a single transistor or as a plurality of transistors (whose channels are) connected together in parallel.

The differential amplifier may be an operational amplifier, such as an operational transconductance amplifier. The differential amplifier may have first and second inputs, connected to sense voltages at the first and second nodes, respectively. The first and second inputs may be (directly) connected to the first and second nodes, respectively. The first input may be an inverting input and the second input may be a non-inverting input, for example in the case of an operational amplifier.

The first component may be implemented as a plurality of first sub-components connected (in parallel) between the first node and a reference node having a first DC reference potential or respective reference nodes having the first DC reference potential. The first potential difference may comprise (at least one of the) respective potential differences across the first sub-components so that the magnitude of the first leakage current is dependent on the (at least one of the) respective potential differences across the first sub-components. The AC coupling may be connected to superimpose an AC-component of the potential difference across one of the first sub-components on the second potential difference.

The second component may be implemented as a plurality of second sub-components connected (in parallel) between the second node and a reference node having a second DC reference potential or respective reference nodes having the second DC reference potential. The second potential difference may comprise respective potential differences across the second sub-components so that the magnitude of the second leakage current is dependent on the respective potential differences across the second sub-components.

The plurality of first sub-components may comprise a given number of first sub-components. The plurality of second sub-components may comprise the given number of second sub-components. The AC coupling may be connected to superimpose AC-components of the potential differences across the given number of first sub-components on the potential differences across the given number of second sub-components, respectively.

The given number may be any integer, for example greater than or equal to two. Where the given number is two, the two first sub-components may comprise a differential pair of varactors of a differential voltage-controlled oscillator.

The second DC reference potential may be substantially the same as the first DC reference potential.

The AC coupling may comprise: a capacitive connection; a connection via a capacitor or impedance or impedance having a capacitance component; and/or a connection between a node whose voltage is representative of the first potential difference and a node whose voltage is representative of the second potential difference. The AC coupling may comprise a DC decoupling.

According to an embodiment of a second aspect of the present invention there is provided a phase-locked loop circuit comprising a leakage-current compensation circuit according to the aforementioned first aspect of the present invention.

According to an embodiment of a third aspect of the present invention there is provided integrated circuitry, such as an IC chip, comprising a leakage-current compensation circuit according to the aforementioned first aspect of the present invention or a phase-locked loop circuit according to the aforementioned second aspect of the present invention.

In some instances, the AC coupling may be optional.

According to an embodiment of a fourth aspect of the present invention there is provided a leakage-current compensation circuit, comprising: a first node for connection of a first component thereto, whereby a first leakage current flows through the first component and through the first node with a given polarity with respect to the first node, the magnitude of the first leakage current dependent on a first potential difference across the first component; a second component connected to a second node and configured such that a second leakage current flows through the second component and through the second node, the magnitude of the second leakage current dependent on a second potential difference across the second component; a current mirror connected to the first node and the second node and configured to cause a compensation current to flow through the first node with opposite polarity to the first leakage current with respect to the first node, the magnitude of the compensation current dependent on the magnitude of the second leakage current due to current mirroring; and a differential amplifier configured, based on a difference between the first potential difference and the second potential difference, to control a feedback component connected in series with the second component along a current path carrying the second leakage current to cause the second potential difference to track the first potential difference. The first leakage component may be a varactor of a VCO, or another component where the potential difference across that component has a substantial AC component.

The present disclosure extends to method aspects corresponding to the above apparatus (circuit) aspects.

Reference will now be made, by way of example, to the accompanying drawings, of which.

Taking a PLL (a PLL circuit) as an example, a typical circuit includes a loop filter, and the loop filter typically includes an integration capacitor over which a voltage is controlled by a charge pump. That voltage is then typically employed to control a VCO whose output oscillation signal or signals form an output of the PLL.

Where the PLL is manufactured using complementary metal-oxide semiconductor (CMOS) processes, the gate capacitance of an n-channel field-effect transistor (FET) can be used as the integration capacitor. When a MOS capacitor is used in PLL loop filters, the associated leakage current (if not compensated for) results in current mismatch at the charge pump output. This causes a phase offset in the PLL lock state, and, consequently, large ripple (i.e. reference spurs) and increased noise contribution from the charge pump.

The VCO may also employ MOS varactors, which may similarly suffer from leakage currents. In dual path (i.e. differential) PLLs, for example, the leakage current in the integration path (affected by the leakage currents of the integration capacitor of the loop filter as well as varactors of the VCO) causes a phase offset which is proportional to the ratio $I_{leak}/I_{cpl}$, where $I_{leak}$ is the leakage current and $I_{cpl}$ is the integration charge pump current.

Typical values for $I_{cpl}$ may be in the order of some μA, and, the leakage current for big varactors (required for high VCO gain) could potentially also be in the order of μA. If this ratio is 1/5 for example, in the PLL lock state the phase skew could be in the order of 70 degrees. As a consequence, reference spurs at the output could be really significant, and, in addition, other harmonics may appear and increased noise contribution from the charge pump may be injected into the PLL output. Such a scenario may be unacceptable in a typical RF (radio frequency) application, for example.

Figure 1:
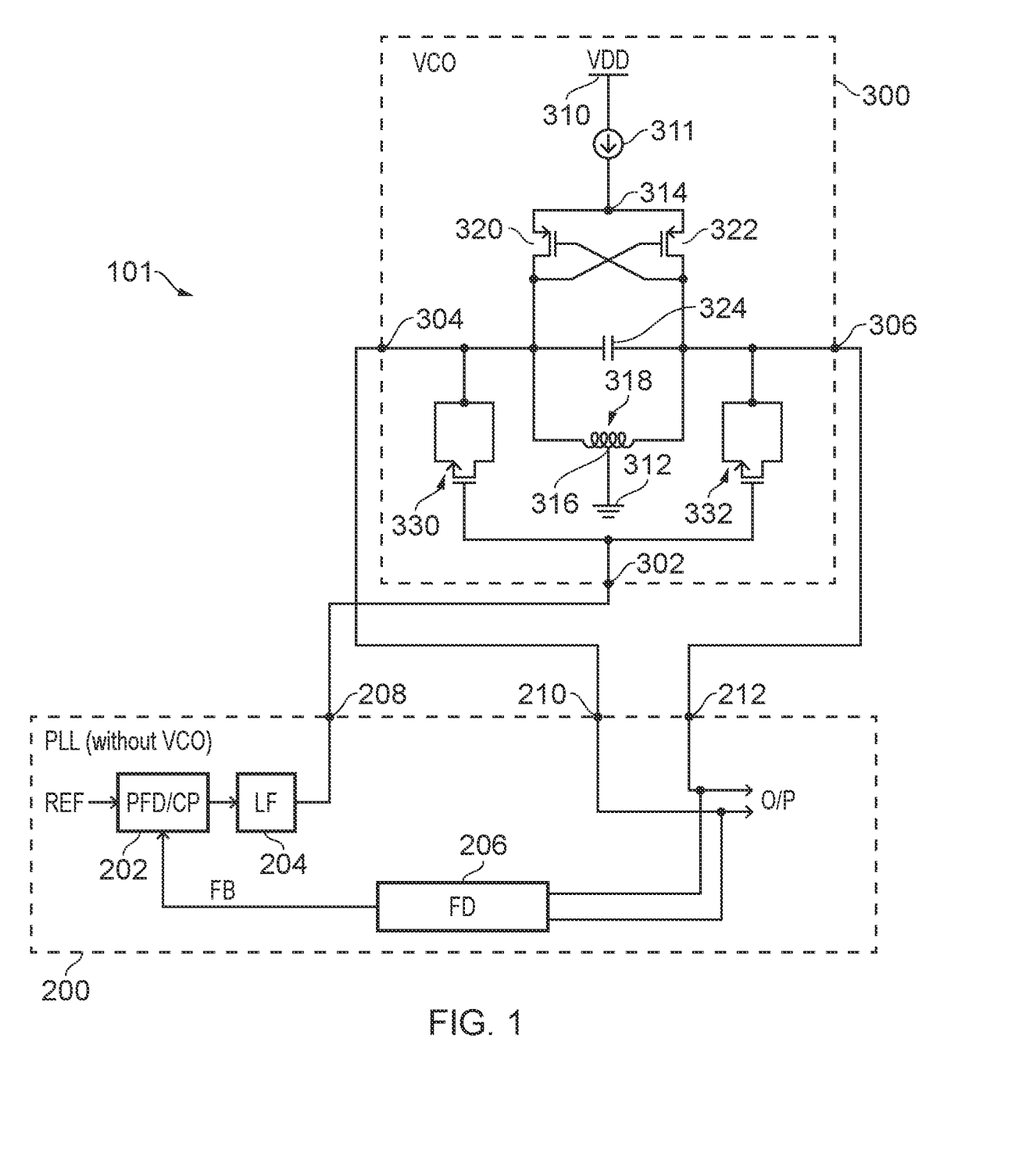
FIG. 1 is a schematic diagram of an example PLL.

For a better understanding, FIG. 1 is a schematic diagram of an example PLL 101, which may be referred to as a PLL circuit or, for example, a clock generator. For simplicity, focus will be placed on varactors of the VCO of the PLL, as example leakage or leaky components (i.e. components which have leakage currents). It will therefore be assumed— for convenience—that an integration capacitor in the loop filter is an ideal (i.e. leakage-current free) capacitor.

With the above in mind, the PLL 101 is shown as comprising a main section 200 and a VCO 300. The main section 200 effectively constitutes the PLL 101 but without its VCO 300.

The main section 200 comprises a phase frequency detector/charge pump (PFD/CP) 202, a loop filter (LF) 204 and a frequency divider (FD) 206. Also shown are an output node 208 and input nodes 210, 212.

The PFD/CP 202 may be considered to be the combination of a phase frequency detector and a charge pump. In some instances, a phase frequency detector may be considered to comprise a charge pump. The PFD/CP 202 compares the frequency and phase of the input signal REF to the frequency and phase of the feedback signal FB from the FD 202. Depending on the difference between these frequencies and phases, the charge pump either injects charge (current) on to, or draws charge from, an integration capacitor (not shown) of the LF 204. An integration voltage formed over the integration capacitor is therefore controlled by the PFD/CP 202 and appears at the output of the LF 204 and therefore at the output node 208.

Ignoring for now the specific implementation of the VCO 300 explicitly shown in FIG. 1 by way of example, the VCO 300 receives the integration voltage at an input node 302 and outputs differential oscillator output signals at respective output nodes 304 and 306 in dependence upon the integration voltage.

The differential oscillator output signals provided at output nodes 304 and 306 of the VCO 300 are connected to the input nodes 210 and 212, respectively, of the main section 200 and thus form output signals (e.g. differential clock signals) of the main section 200 and thus of the overall PLL 101 as indicated. The differential oscillator output signals provided at output nodes 304 and 306 thus also form input signals to the FD 206, which generates the feedback signal FB (which may also be a differential signal) based thereon by frequency division.

In this way, the frequency and phase of the differential oscillator output signals provided at output nodes 304 and 306 (which form outputs signals of the overall PLL 101) is controlled by the frequency and phase of the input signal REF and the frequency division performed by the FD 206. Of course, the PLL 101 is merely one example of a range of well-known PLL circuits and their basic operation as described above is well understood. The topology of the PLL 101 will be carried forward herein as a running example, for ease of understanding, however the skilled person will understand that the techniques described later herein may be applied to a range of different PLL topologies and indeed to other circuits having leakage components.

For a better understanding, focus will now be placed on the example implementation of the VCO 300 explicitly shown in FIG. 1.

In the example implementation, the VCO 300 comprises a differential pair of current paths which extend between an upper voltage reference node (e.g. VDD or AVD) 310 and a lower voltage reference node (e.g. ground, GND) 312. That pair of current paths pass in common or together (i.e. as a single current path) between node 310 and a tail node 314 via a current source 311, which sets a bias current (i.e. DC current) flowing along those paths. Those paths then path separately from the tail node 314 to another tail node 316, which forms the central tapping point of a centre-tapped inductor 318, via the two halves of that inductor, as shown. From the tail node 316 the paths then pass again in common or together (i.e. as a single current path) to node 312.

The output nodes 304 and 306 are defined at corresponding positions along the pair of current paths, respectively, between the tail node 314 and the centre-tapped inductor 318.

A transistor 320 is provided (with its channel connected) along one of the current paths between the output node 304 and the tail node 314 and another transistor 322 is provided (with its channel connected) along the other one of the current paths between the output node 306 and the tail node 314, and form a differential pair of transistors. In this example, the transistors 320, 322 are PMOS transistors and they are cross-coupled in the sense that the gate terminal of one is connected to the drain terminal of the other, and vice versa.

A capacitor 324 is connected between the output nodes 304 and 306. Further, a varactor 330 is connected between the output node 304 and the input node 302 and another varactor 332 is connected between the output node 306 and the input node 302. Here, the varactors 330, 332 are implemented as MOS transistors or MOS capacitors, in this case NMOS transistors, whose source and drain terminals are connected together to form one terminal of the varactor, and whose gate terminal forms the other terminal of the varactor. For each of varactors 330, 332, their bulk terminal could be connected to their source and drain terminals or connected e.g. to the lowest available reference potential (e.g., ground, GND). A varactor here may be referred to as a varicap diode, varactor diode, variable capacitance diode, variable reactance diode or tuning diode, but in the case of the FIG. 1 example implementation is a MOS capacitor.

The VCO 300 in its shown example implementation is configured to have a balanced operation. Effectively, the differential oscillator output signals provided at output nodes 304 and 306 are AC signals which oscillate about DC ground, and are substantially out of phase with one another. In this way, the output nodes 304 and 306 have a ground (GND) common-mode voltage, and the input node 302 may be referred to as an AC (virtual) ground terminal. The integration voltage (which is a low frequency signal, effectively DC) provided at the input node 302 then controls the capacitances of the varactors 330 and 332 and thus the frequency of the differential oscillator output signals provided at output nodes 304 and 306.

The topology of the example implementation of the VCO 300 will also be carried forward herein as a running example, again for ease of understanding, however the skilled person will understand that the techniques described later herein may be applied to a range of different VCO topologies and indeed to other circuits having leakage components.

Focus, will now be placed on the leakage currents of the varactors 330 and 332.

As explained earlier, MOS capacitors/varactors suffer from gate leakage due to a gate-tunneling effect. The leakage currents therefore flow from the input node 302 (which corresponds to the gate terminals of the varactors) through the varactors 330 and 332 to the output nodes 304 and 306, and effectively drain charge from node 302. It is recalled that the integration voltage is formed over the integration capacitor (not shown) of the LF 204 and controlled by the PFD/CP 202, by pumping charge onto or drawing charge from that integration capacitor. A (effectively, DC) leakage current which flows through the input node 302 (the sum of the leakage currents which flow through the varactors 330 and 332) therefore affects this charge on the integration capacitor and thus affect the integration voltage itself, generating an error in that voltage and thus in the overall operation of the PLL 101.

The induced gate leakage current of the varactors 330, 332 has a non-linear exponential relationship with the applied gate voltage (gate-source voltage). Due to the non-linear dependence on gate voltage, the resultant leakage can be divided into two components, which may be referred to as a static (DC) component and a dynamic (AC) component. The static component corresponds to the average (DC or bias) gate voltage applied to the MOS varactor (capacitor). The dynamic component then results from self-mixing of AC signals due to the non-linear leakage behaviour.

Figure 2:
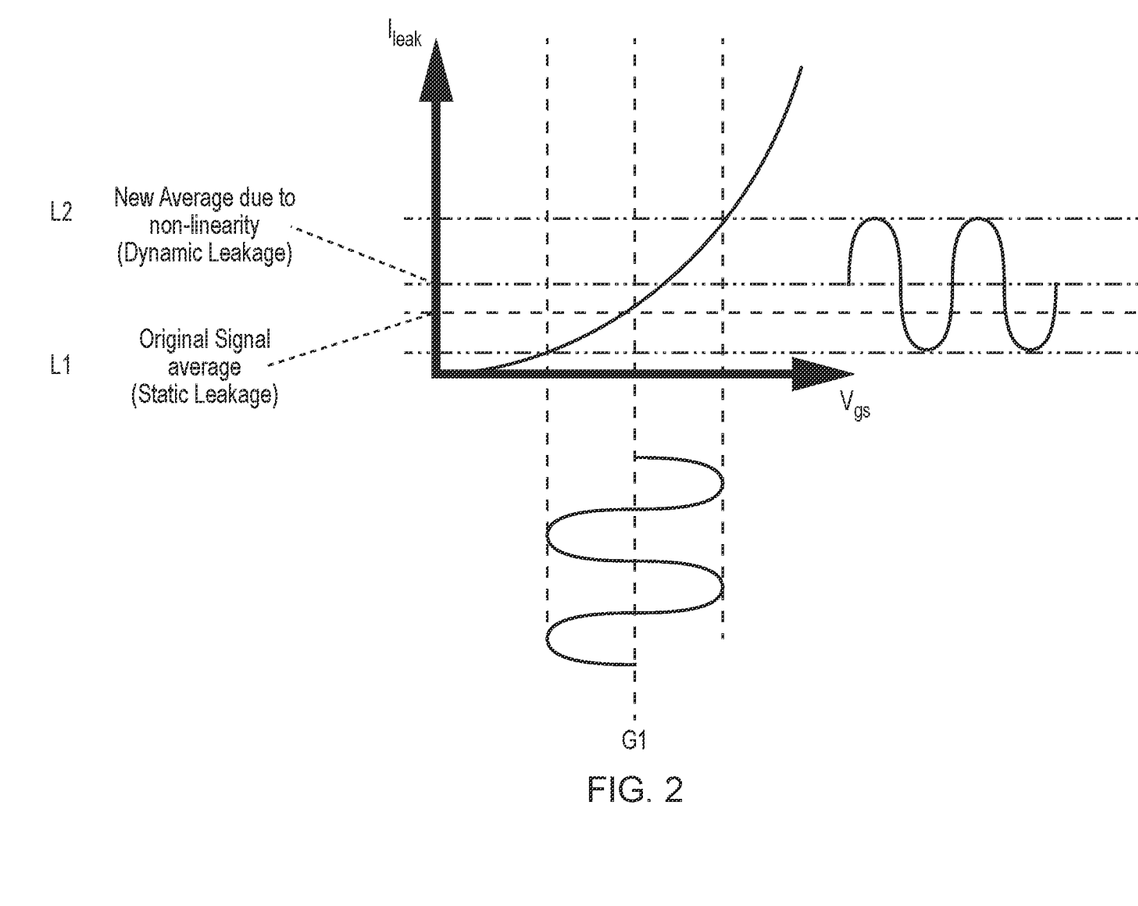
FIG. 2 is a graph useful for understanding leakage current formation.

FIG. 2 is a graph illustrating how both components are generated, in general terms. The gate-source voltage $V_{gs}$ is represented on the x-axis and the leakage current $I_{leak}$ is represented on the y-axis. An example non-linear (i.e. exponential) relationship between the leakage current $I_{leak}$ and the gate-source voltage $V_{gs}$ is plotted on the graph.

For the purposes of explanation, it is assumed that a sine-wave gate-source voltage $V_{gs}$ with average G1 is applied to the gate of MOS varactor as shown under the graph for comparison with the x-axis, and a resultant sine-wave leakage current $I_{leak}$ is generated in the MOS varactor as shown to the right of the graph for comparison with the y-axis.

As a result of the relationship indicated in the graph, the mean value G1 generates a corresponding leakage current of L1. However, the time-varying sine-wave gate-source voltage $V_{gs}$ will cause the leakage current $I_{leak}$ to have higher values with sine-wave maxima and lower values with minima, respectively. Since the leakage current value $I_{leak}$ increase for maxima is larger than the leakage value decrease for minima, due to the non-linear relationship, a new DC-component leakage current L2 is generated which is dependent on the sine-wave maxima and minima of the gate-source voltage $V_{gs}$, i.e. effectively on the AC component of the gate-source voltage $V_{gs}$. Therefore, by taking into account the AC component of the gate-source voltage $V_{gs}$ of a MOS varactor a more accurate compensation of its leakage current may be achieved than if only its DC component is taken into account.

Figure 3:
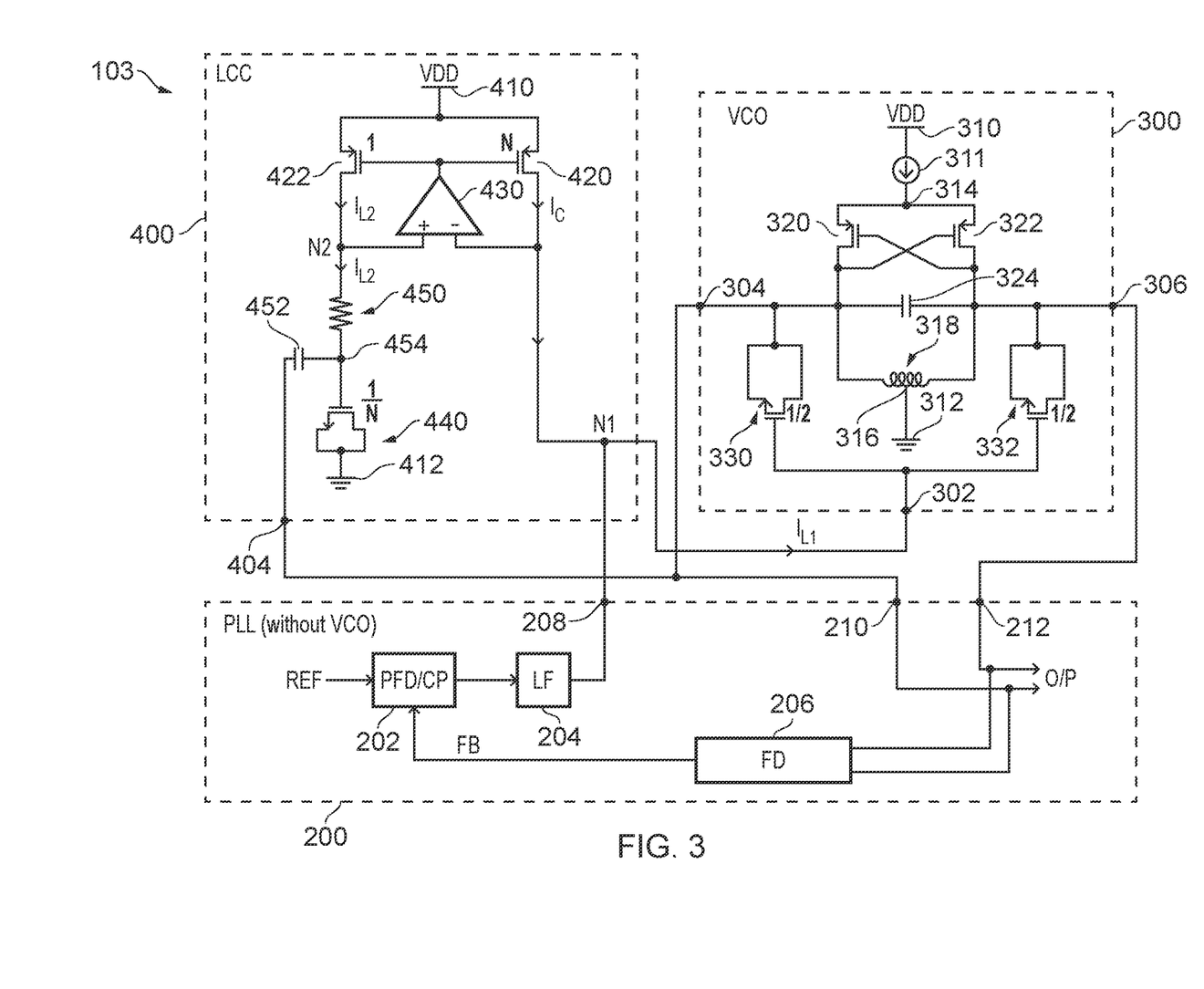
FIG. 3 is a schematic diagram of a PLL embodying the present invention.

Against this backdrop, FIG. 3 is a schematic diagram of an example PLL 103 which embodies the present invention.

In line with the running example, the PLL 103 is the same as the PLL 101 except that it further includes a leakage compensation circuit (LCC) 400, which itself embodies the present invention. The PLL 103 therefore comprises the main section 200 and VCO 300, connected in the same way as in FIG. 1 and duplicate description is omitted. Like elements are denoted by like reference signs.

Focus will therefore be placed on the LCC 400.

The LCC 400 comprises an output node N1 (referred to as a first node) and an input node 404, by way of which it interfaces with the main section 200 and VCO 300. In detail, the LCC 400 comprises a pair of current paths, a first one of which extends from an upper voltage reference node (e.g. VDD or AVD) 410 to the first node N1, and a second one of which extends from the upper voltage reference node 410 to a lower voltage reference node (e.g. ground, GND) 412 via a second node N2.

A transistor 420 is provided along the first current path between node 410 and the first node N1, and another transistor 422 is provided along the second current path between node 410 and the second node N2. In this example, the transistors 420, 422 are PMOS transistors and their gate terminals are coupled together.

A differential amplifier 430 is provided, which in this example is an operational amplifier (op-amp) such as an OTA (operational transconductance amplifier) having an inverting input (−), a non-inverting input (+) and an output. The inverting input is connected to sense a voltage level at the first node N1, in this case by being (directly) connected to the first node N1. Similarly, the non-inverting input is connected to sense a voltage level at the second node N2, in this case by being (directly) connected to the second node N2. The output of the differential amplifier 430 is connected to control the gate voltages of the transistors 420 and 422.

A varactor 440 is connected along the second current path between the second node N2 and the lower voltage reference node 412. As before, the varactor 440 is implemented as a MOS transistor/capacitor, in this case an NMOS transistor, whose source and drain terminals are connected together to form one terminal of the varactor, and whose gate terminal forms the other terminal of the varactor. As before, the bulk terminal of the varactor 440 could be connected to the source and drain terminals of that varactor or connected e.g. to the lowest available reference potential (e.g., ground, GND). Effectively, the bulk terminal of the varactor may be connected in a similar way to that of each of the varactors 330, 332.

A resistor 450 is also connected along the second current path, in this case between the second node N2 and the gate terminal of the varactor 440. A capacitor 452 is connected between the input node 440 and an intermediate node 454 between the resistor 450 and the gate terminal of the varactor 440.

As indicated, the output node or first node N1 of the LCC 400 is connected to the input node 302 of the VCO 300 and also to node 208. The input node 404 of the LCC 400 is connected to the output node 304 of the VCO 300, as an example one of the output nodes 304 and 306. The input node 404 could instead be connected to the output node 306.

The differential amplifier 430 and the transistor 422 as connected to the first and second nodes N1 and N2 form a control loop with negative feedback. In particular, the differential amplifier 430 controls the transistor 422 to try to force a voltage level at the second node N2 to be equal to a voltage level at the first node N1. As can be seen from FIG. 3, when the voltage level at the first and second nodes N1 and N2 are (substantially) the same, the gate-source voltage for the varactor 330 of the VCO 300 is very close to being the same as the gate-source voltage for the varactor 440 of the LCC 400. Recall that the output node 304 has a ground (GND) common-mode voltage which may be compared with the lower voltage reference node 412 in terms of DC voltage level. Also, it is assumed that the resistance value of the resistor 450 is set to be small enough so that negligible DC voltage drop occurs across the resistor 450 due to leakage current flowing along the second current path of the LCC 400.

Assuming that the varactors 330 and 440 are formed from n-channel (e.g. NMOS) transistors manufactured in the same CMOS manufacturing process (as they are in the present example), and have the same size/dimensions as one another, then they will have substantially the same leakage current as one another in this state (i.e. where their gate-source voltages are substantially the same), allowing of course for manufacturing process variations etc. However, in the present example, as indicated in FIG. 3, the varactor 440 is a scaled version of the varactor 330. In particular, the varactors 330 and 332 are each indicated as having a size 1/2 (so that together they are equivalent to a varactor of size 1) and the varactor 440 is indicated as having a size 1/N. It is assumed in this way that the varactors 330 and 332 have the same size/dimensions as one another, and that the varactor 440 is scaled relative to them as defined by the value of N. In this sense, the varactor 440 may be referred to as a 'replica' varactor, and be considered a replica of the varactors 330, 332. The varactors 330, 332 (or any of them) may then be considered a 'target' varactor. Of course, if N=2, then those varactors all have the same size/dimensions as one another.

In this case, the varactor 440 may be considered a scaled version of the varactor 330 in the sense that its gate area or channel W*L area is 2/N times the gate area or W*L area of the varactor 330, where W is channel width and L is channel length.

In FIG. 3, the leakage current (first leakage current) of the balanced varactors 330 and 332 is labelled $I_{L1}$, and is shown being drawn by the varactors 330 and 332 together from the first node N1. This first leakage current $I_{L1}$ is effectively double the leakage current of one of the varactors 330 and 332. Similarly, the leakage current (second leakage current) of the varactor 440 is labelled $I_{L2}$, and is shown being drawn by the varactor 440 from the second node N2.

Assuming that N>1, the second leakage current $I_{L2}$ will be N times smaller than the first leakage current $I_{L1}$. The second leakage current $I_{L2}$ passes through the transistor 422 in the second current path and, given that the transistors 422 and 420 have the same gate, drain and source voltages and function as a current mirror, a compensation current $I_C$ is caused to flow through the transistor 420 in the first current path which is dependent on (substantially proportional to) the second leakage current $I_{L2}$ due to current mirroring.

In this example, as indicated in FIG. 3, the transistor 420 is N times larger than the transistor 422, in that its channel width is N times larger. Therefore, the compensation current $I_C$ is substantially N times larger than the second leakage current $I_{L2}$, and should substantially cancel the first leakage current $I_{L1}$ being drawn from the first node N1, so that the net current drawn from the first node N1 is substantially zero. In this case, where the compensation current $I_C$ is substantially equal in magnitude to the first leakage current $I_L$, the net charge drawn from the integration capacitor (via node 208) will also be substantially zero. Of course, any inaccuracies in the value of N in the instances where it is deployed, and process variations etc., will affect the degree of cancellation and as such the cancellation may be at least partial in practice.

Incidentally, the transistor 420 may be implemented as being N times larger than the transistor 422 by connecting N transistors identical to the transistor 422 in parallel with one another. Similarly, the varactor 330 may be implemented as being N times larger than the varactor 440 by connecting N varactors identical to the varactor 440 in parallel with one another.

With reference back to FIG. 2, it is recalled that the AC component of the gate-source voltage affects the leakage current to the extent that its DC average value is affected. So far, the control of the voltage at the second node N2 (and thus of the gate-source voltage of the varactor 440) has been described in relation to the differential amplifier 430 and the transistor 422 as connected to the first and second nodes N1 and N2 forming a control loop with negative feedback. That control loop has a control-loop frequency bandwidth defined at least in part (i.e. limited) by the differential amplifier 430, and as such the voltage level at the second node N2 may not be able to track (tend to be substantially the same as, or related to) the voltage level at the second node N1 at frequencies above that control-loop bandwidth. For example, the differential oscillator output signals provided at output nodes 304 and 306 may be AC signals with an example frequency of several Gigahertz (GHz), and the control-loop frequency bandwidth defined at least in part by the differential amplifier 430 may be, in practice, in the Megahertz (MHz) or kilohertz (kHz) range.

With this in mind, attention is drawn to the resistor 450 and capacitor 452 (i.e. RC section), and in particular to the connection from the output node 304 to the input node 404. Effectively, with reference back to FIG. 2, the static leakage component is compensated through the feedback action of the differential amplifier 430 and the transistor 422 as explained above. The RC-section 450, 452 is added with the R value (of resistor 450) set to be small enough so that negligible DC drop occurs across the resistance due to leakage current, and with the C value (of capacitor 452) set to be large enough such that all (or substantially all) of the AC-component of the gate-source voltage of the varactor 330 is superimposed on the gate-source voltage of the varactor 440. As a result, the gate-source voltage across the replica varactor 440 is equal to the DC-component forced by the control loop, plus the AC-coupled swing. In this way, the overall second leakage current $I_{L2}$ more accurately reflects (i.e. is a scaled version of) the first leakage current $I_{L1}$, so that the compensation current $I_C$ more accurately compensates the original first leakage current $I_{L1}$.

The AC coupling provided by way of the capacitor 452 and the resistor 450 is one example way of superimposing the AC-component of the gate-source voltage of the varactor 330 on the gate-source voltage of the varactor 440. The skilled person will understand that other impedance networks or circuits can be used to provide the AC coupling, and for example a DC decoupling.

Figure 4A:
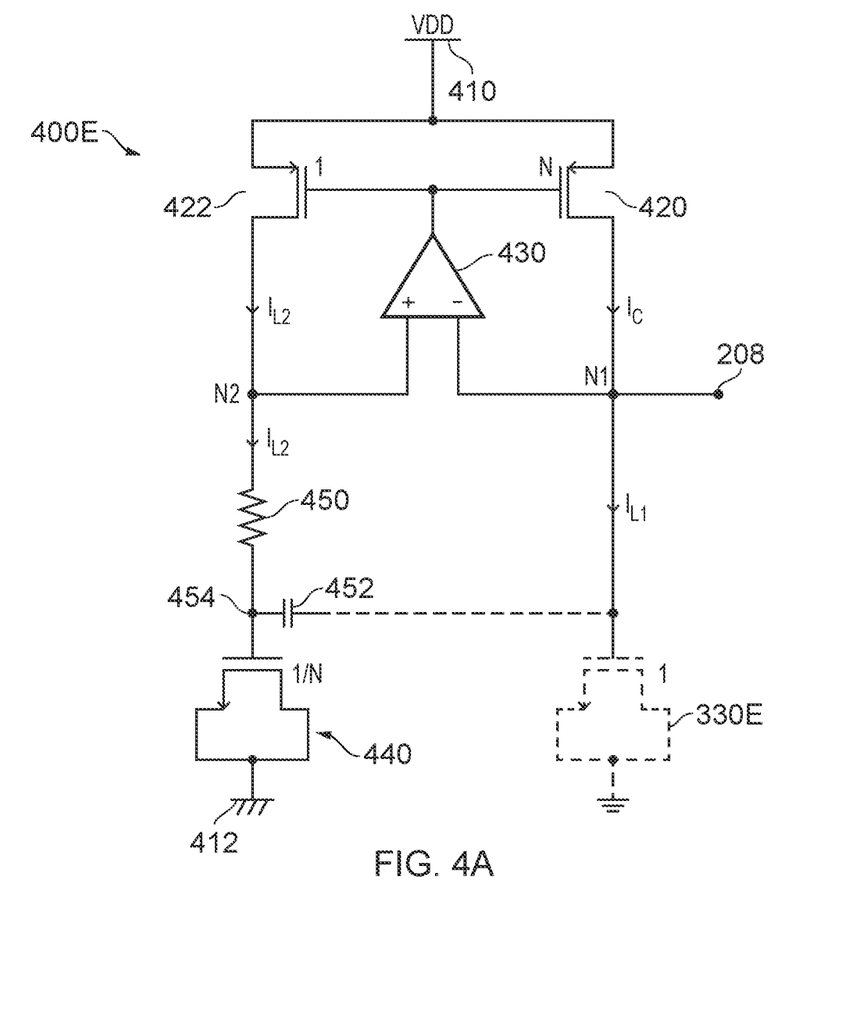
FIG. 4A is a schematic diagram useful for understanding the PLL of FIG. 3.

FIG. 4A is a schematic diagram of an LCC 400E which may be considered equivalent to the LCC 400, for ease of understanding the LCC 400. Like elements are denoted with like reference signs and duplicate description is omitted.

A varactor 330E equivalent to the combination of varactors 330 and 332 (and indicated in dashed form as such) is shown connected between the first node N1 and a lower voltage reference node (e.g. ground, GND) equivalent to node 412. Similarly, a connection between the capacitor 452 and the gate terminal of the varactor 330E is shown in dashed form. The connection between nodes N1 and 208 is also shown. The varactor 330E is equivalent to the combination of varactors 330 and 332, which varactors 330 and 332 may be considered effectively connected in parallel, and is therefore given a relative size 1 in FIG. 4A compared to the size 1/N of the varactor 440.

Here, it can be more readily appreciated that the compensation current $I_C$ compensates (i.e. substantially cancels out, or at least reduces) the effect of the first leakage current $I_{L1}$ at the first node N1. It can also be appreciated that the LCC 400E, and thus also the other LCCs disclosed herein, may be provided without the target varactors 330, 332, 330E (or, indeed, also without the replica varactor 440) or including the target varactors 330, 332, 330E. Further, the target and replica varactors are merely convenient examples of leaky components. It will be appreciated that those components could be replaced with other types of leaky component, such as varactor diodes, for example.

Figure 4B:
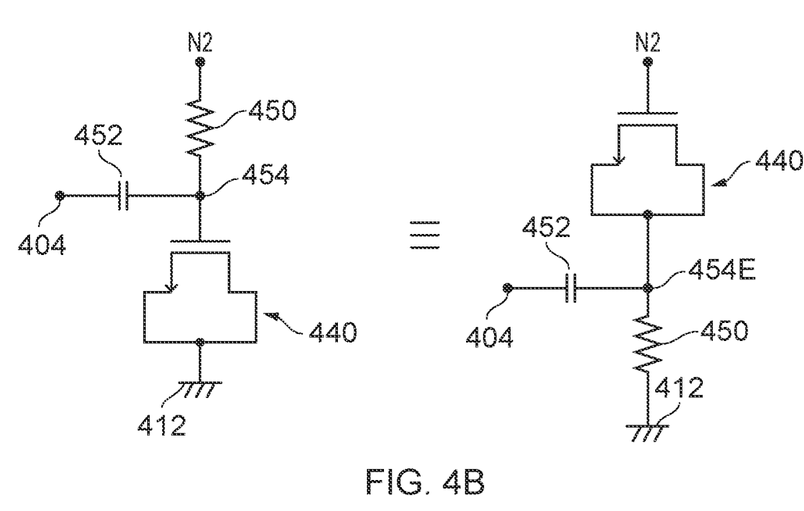
FIG. 4B is a schematic diagram useful for understanding a modification of the PLL of FIG. 3.

FIG. 4B is a schematic diagram showing part of the LCC 440, on the left-hand side, and an equivalent circuit, on the right-hand side. Again, like elements are denoted with like reference signs and duplicate description is omitted. It will be appreciated that the AC coupling need not be made to the gate-terminal side of the varactor 440, as in the left-hand circuit and FIG. 3, and may instead be made to the drain-source terminal side, as in the right-hand circuit. The intermediate node 454E is equivalent to the intermediate node 454. The circuits disclosed herein will be understood accordingly.

Figure 5:
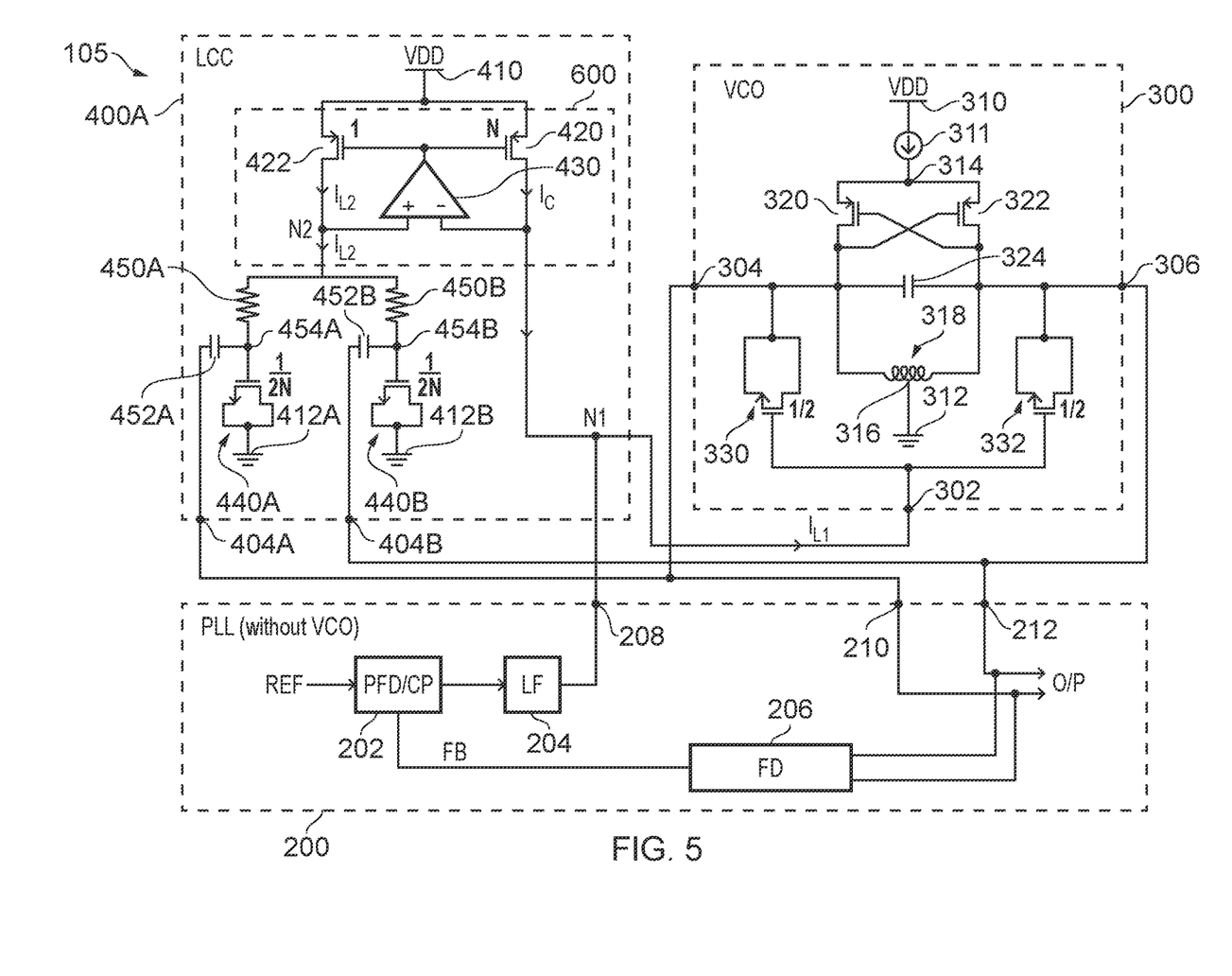
FIG. 5 is a schematic diagram of a PLL embodying the present invention.

FIG. 5 is a schematic diagram of another example PLL 105 which embodies the present invention.

In line with the running example, the PLL 105 is the same as the PLL 103 except that it includes a leakage compensation circuit (LCC) 400A, being an adapted version of the LCC 400. Focus will therefore be placed on differences between the LCC 400A and the LCC 400. Like elements are denoted by like reference signs, and duplicate description is omitted.

The difference between the LCC 400A and the LCC 400 is that it comprises parallel A and B paths from the second node N2 to respective lower voltage reference nodes (e.g. ground, GND) 412A and 412B. That is, the second current path which passes through the second node N2 splits into parallel A and B current paths. Each of those parallel paths has corresponding components to those of the single path in the LCC 400, denoted with the suffix A or B depending on the path concerned.

Thus, taking the A path first, a varactor 440A is connected along the A current path between the second node N2 and the lower voltage reference node 412A. A resistor 450A is also connected along the A current path, in this case between the second node N2 and the gate terminal of the varactor 440A. A capacitor 452A is connected between an input node 440A and an intermediate node 454A between the resistor 450A and the gate terminal of the varactor 440A. Similarly, a varactor 440B is connected along the B current path between the second node N2 and the lower voltage reference node 412B. A resistor 450B is also connected along the B current path, in this case between the second node N2 and the gate terminal of the varactor 440B. A capacitor 452B is connected between an input node 440B and an intermediate node 454B between the resistor 450B and the gate terminal of the varactor 440B.

A purpose of the LCC 400A over the LCC 400 is that the LCC 400A can have a balanced operation taking advantage of both of the differential oscillator output signals provided at output nodes 304 and 306 (which form outputs signals of the overall PLL 105). That is, the input node 440A is connected to node 304 (in line with node 440 of LCC 400) and the input node 440B is connected to node 306. Therefore, the gate-source voltage of the replica varactor 440A tracks (in AC and DC terms) the gate-source voltage of the target varactor 330, and the gate-source voltage of the replica varactor 440B tracks (in AC and DC terms) the gate-source voltage of the target varactor 332.

In order that the second leakage current $I_{L2}$ is a 1/N scaled version of the first leakage current $I_{L1}$ (as in the LCC 400), the replica varactors 440A and 440B are 1/2N scaled versions of the combination of the target varactors 330 and 332, or 1/2N scaled relative to the 1/2 size of each of the target varactors 330 and 332. Of course, another possibility would be for the replica varactors 440A and 440B to be 1/N scaled versions of the combination of the target varactors 330 and 332, or 1/N scaled relative to the 1/2 size of each of the target varactors 330 and 332, and for the transistor 420 instead to be N/2 times larger than the transistor 422. Other possibilities are of course possible, and will readily occur to the skilled person with the overall aim of ensuring that the compensation current $I_C$ and the first leakage current $I_{L1}$ are (substantially) equal in magnitude, and opposite in polarity as regards the first node N1 (in the sense that one of the currents flows out of that node, and the other one of them flows into that node).

Figure 6:
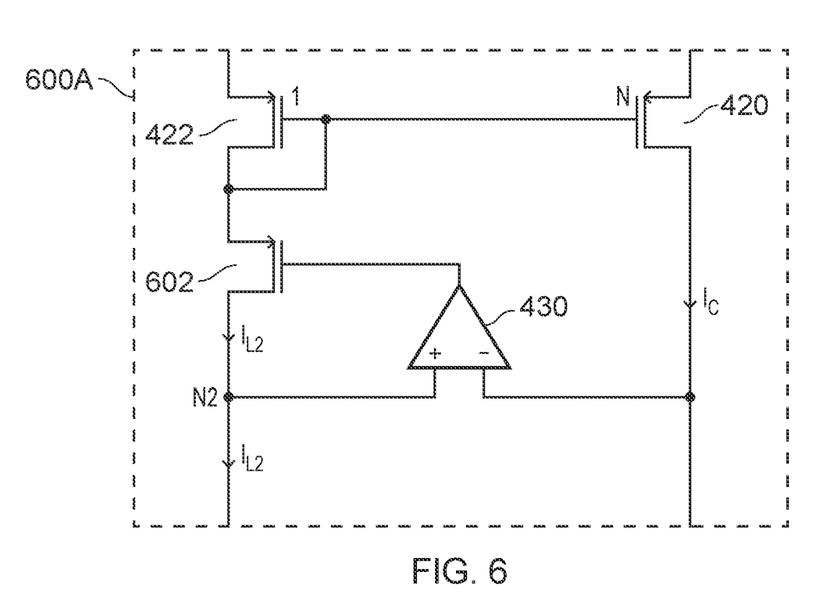
FIG. 6 is a schematic diagram useful for understanding a modification of the PLL of FIG. 3 or 5.

FIG. 6 is a schematic diagram of a portion 600A of an LCC being an adapted version of the corresponding portion 600 indicated in FIG. 5 (an identical portion also exists in FIG. 3, although not indicated as such). The portion 600 in FIG. 5 (or the identical portion in FIG. 3) could be replaced with the portion 600A.

The portion 600A is similar to the portion 600. Like elements are denoted by like reference signs, and duplicate description is omitted.

The portion 600A differs from the portion 600 in that the transistor 422 (and 420) is no longer directly controlled by the differential amplifier 430. Instead, the transistor 422 is diode-connected, so as to form a current mirror with the transistor 420, and an additional transistor 602 (here, a PMOS MOSFET) is provided in the second current path between the transistor 422 and the second node N2, whose gate is controlled by the output of the differential amplifier 430.

The operation of the portion 600A is similar to that of the portion 600A. The differential amplifier 430 and the transistor 602 as connected to the first and second nodes N1 and N2 form a control loop with negative feedback. In particular, the differential amplifier 430 controls the transistor 602 to try to force a voltage level at the second node N2 to be equal a voltage level at the first node N1. Thus, the overall operation of the LCC 400 or the LCC 400A, when employing the portion 600A rather than the portion 600, would be substantially the same as when employing the portion 600 rather than the portion 600A. The portion 600 may be considered advantageous compared to the portion 600A as it requires fewer devices in the second current path and thus, importantly, less voltage headroom.

Figure 7:
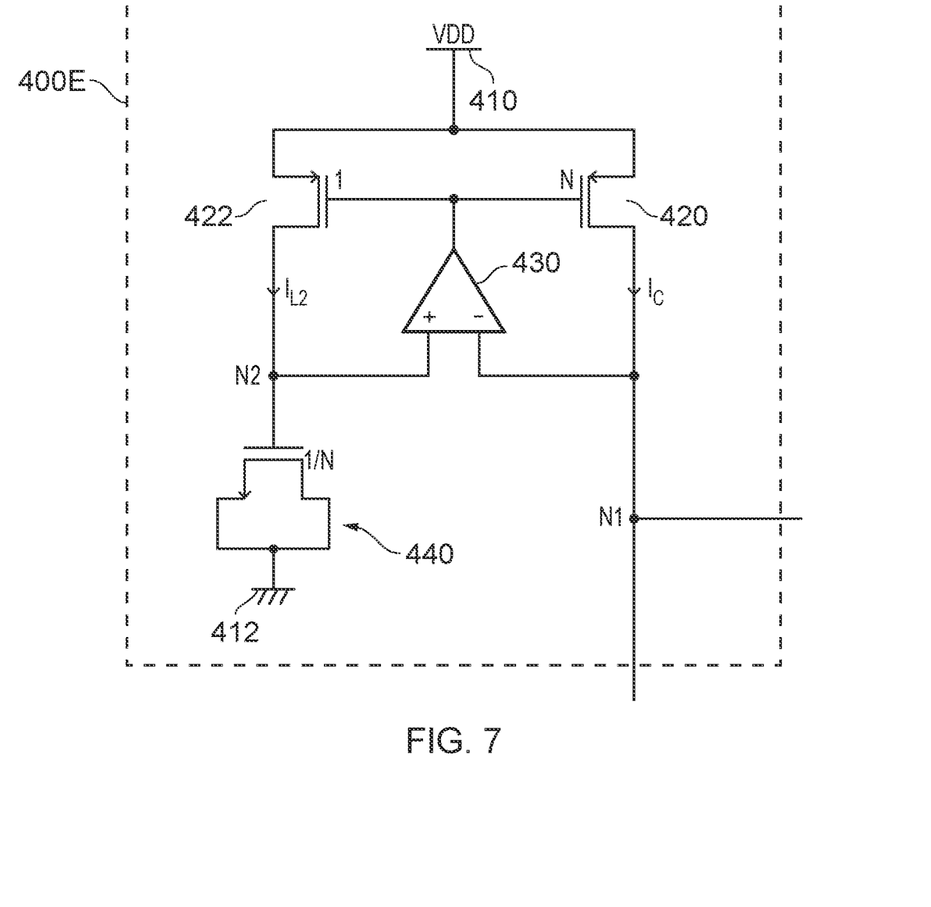
FIG. 7 is a schematic diagram useful for understanding a modification of the PLL of FIG. 3 or 5.

FIG. 7 is a schematic diagram of a leakage compensation circuit (LCC) 400E, being an adapted version of the LCC 400 in which the AC coupling provided by way of the RC-section 450, 452 (useful for compensating the dynamic leakage of high-frequency dynamic components) is excluded. Thus, the LCC 400E does not have the input node 404 and the varactor 440 is connected along the second current path to the second node N2 without the resistor 450 therebetween.

As explained earlier, the RC-section 450, 452 enables the AC-component of the gate-source voltage of the varactor 330 to be superimposed on the gate-source voltage of the varactor 440. Without the RC-section 450, 452, the gate-source voltage across the replica varactor 440 is equal to the DC-component forced by the control loop, without the AC-coupled swing. In this way, the overall second leakage current $I_{L2}$ reflects (i.e. is a scaled version of) the first leakage current $I_{L1}$ in DC/static terms (see FIG. 2), and this may be acceptable in cases where there is no or negligible AC component (e.g. slowly varying AC-signals) or where the increased accuracy provided by the AC coupling is not needed.

It will be appreciated that an LCC could be provided in line with LCC 400E but corresponding to LCC 400A, in the sense of having A and B paths but without the A and B RC-sections 450A, 452A, and 450B, 452B, and the input nodes 404A, 404B.

As will be appreciated, the various circuits disclosed herein may be referred to, or include, a leakage compensation circuit, in particular which that can compensate gate leakage, resulting from (static and dynamic) gate voltage signals, in MOS capacitors/varactors.

It will be appreciated that the MOS capacitors/varactors described herein are merely examples of leaky components whose leakage currents may be compensated for using the techniques described herein. Other example leaky components include diodes, for example.

It will also be appreciated the various circuits described herein could be implemented in other ways, with the general technique (e.g. see FIG. 4A) employed. For example, as mentioned earlier, various topologies of PLLs and VCOs are known, and the present invention could be applied to those topologies too. Further, a PLL is one example of a circuit which may comprise leaky components. Other examples include RC-filters and capacitor banks.

It will further be appreciated that the various circuits disclosed herein could be implemented "the other way up",
replacing NMOS components with PMOS components and vice versa, as would be readily understood by the skilled person.

Figure 8:
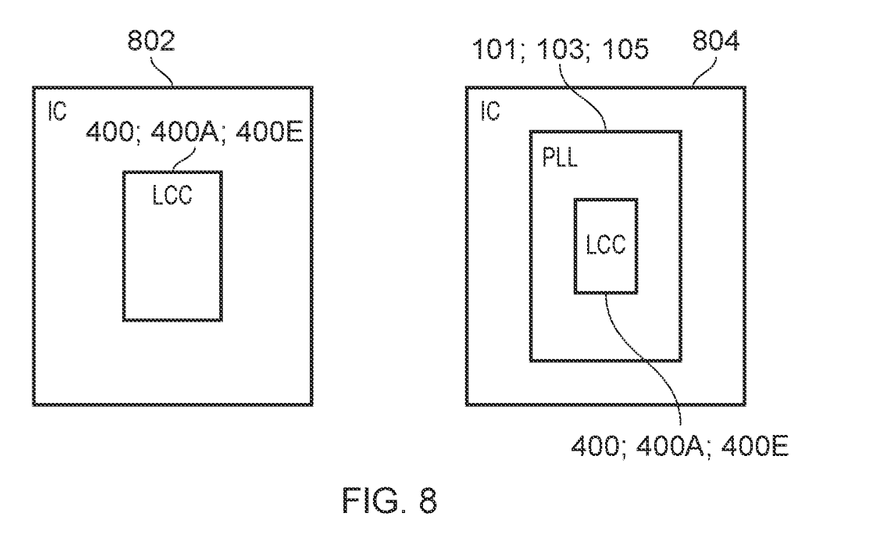
FIG. 8 is a schematic diagram of integrated circuitry embodying the present invention.

FIG. 8 is a schematic diagram of integrated circuitry embodying the present invention. Such integrated circuitry may be implemented as an IC chip, such as a flip chip. Integrated circuitry 802 comprises any of the LCCs disclosed herein. Integrated circuitry 804 comprises any of the PLLs disclosed herein, which themselves may comprise any of the LCCs disclosed herein.

The present invention extends to integrated circuitry and IC chips as mentioned above, circuit boards comprising such IC chips, and communication networks (for example, internet fiber-optic networks and wireless networks) and network equipment of such networks, comprising such circuit boards.

The present invention extends to methods of compensating for leakage currents corresponding to the LCCs disclosed herein.

The invention claimed is:

1. A leakage-current compensation circuit, comprising:
a first node for connection of a first component thereto, whereby a first leakage current flows through the first component and through the first node with a given polarity with respect to the first node, the magnitude of the first leakage current dependent on a first potential difference across the first component;
a second component connected to a second node and configured such that a second leakage current flows through the second component and through the second node, the magnitude of the second leakage current dependent on a second potential difference across the second component;
a current mirror connected to the first node and the second node and configured to cause a compensation current to flow through the first node with opposite polarity to the first leakage current with respect to the first node, the magnitude of the compensation current dependent on the magnitude of the second leakage current due to current mirroring;
a differential amplifier configured, based on a difference between the first potential difference and the second potential difference, to control a feedback component connected in series with the second component along a current path carrying the second leakage current to cause the second potential difference to track the first potential difference; and
an AC coupling connected to superimpose an AC-component of the first potential difference on the second potential difference, wherein:
the differential amplifier is configured to control the feedback component to cause the second potential difference to track the first potential difference over a control-loop frequency bandwidth limited at least in part by the differential amplifier, and
the AC coupling is configured to superimpose the AC-component of the first potential difference on the second potential difference so that the second potential difference tracks the first potential difference over an extended frequency bandwidth larger than said control-loop frequency bandwidth.

2. The leakage-current compensation circuit as claimed in claim 1, wherein the second component is configured such that, when the first potential difference is the same as the second potential difference, the first leakage current and the second leakage current have a defined relationship.

3. The leakage-current compensation circuit as claimed in claim 1, wherein at least one of the followings is satisfied:

the first and second components are leaky components;
the first and second components are components of the same type;
the second component is scaled in size or dimensions relative to the first component;
the first and second components each comprise a field-effect transistor, or a MOS device; or
the first and second components both comprise varactors or capacitors.

4. The leakage-current compensation circuit as claimed in claim 1, wherein the current mirror is configured such that the magnitudes of the compensation current and the second leakage current are substantially proportional to one another.

5. The leakage-current compensation circuit as claimed in claim 1, wherein the current mirror comprises a first transistor connected along a current path carrying the compensation current and a second transistor connected along the current path carrying the second leakage current.

6. The leakage-current compensation circuit as claimed in claim 1, wherein the differential amplifier is configured to control the gate voltages of the first and second transistors.

7. The leakage-current compensation circuit as claimed in claim 1, wherein the feedback component comprises:
the second transistor; or
a further transistor connected in series with the second transistor.

8. The leakage-current compensation circuit as claimed in claim 1, wherein:
the first component is implemented as a plurality of first sub-components connected between the first node and a reference node having a first DC reference potential or respective reference nodes having the first DC reference potential; and
the first potential difference comprises at least one of the respective potential differences across the first sub-components so that the magnitude of the first leakage current is dependent on the at least one of the respective potential differences across the first sub-components.

9. The leakage-current compensation circuit as claimed in claim 8, wherein the AC coupling is connected to superimpose an AC-component of the potential difference across one of the first sub-components on the second potential difference.

10. The leakage-current compensation circuit as claimed in claim 9, wherein:
the second component is implemented as a plurality of second sub-components connected between the second node and a reference node having a second DC reference potential or respective reference nodes having the second DC reference potential; and
the second potential difference comprises at least one of the respective potential differences across the second sub-components so that the magnitude of the second leakage current is dependent on the at least one of the respective potential differences across the second sub-components.

11. The leakage-current compensation circuit as claimed in claim 10, wherein:
the plurality of first sub-components comprises a given number of first sub-components;
the plurality of second sub-components comprises the given number of second sub-components; and
the AC coupling is connected to superimpose AC-components of the potential differences across the given number of first sub-components on the potential differences across the given number of second sub-components, respectively.

12. The leakage-current compensation circuit as claimed in claim 1, wherein the AC coupling comprises at least one of:
a capacitive connection;
a connection via a capacitor or capacitance; or
a connection between a node whose voltage is representative of the first potential difference and a node whose voltage is representative of the second potential difference.

13. A phase-locked loop circuit comprising the leakage-current compensation circuit as claimed in claim 1.

14. Integrated circuitry, comprising the leakage-current compensation circuit as claimed in claim 1.

15. The leakage-current compensation circuitry of claim 2, wherein, when the first potential difference is the same as the second potential difference, a ratio between the second leakage current and the first leakage current is substantially constant.

16. The leakage-current compensation circuit of claim 5, wherein a ratio in the size or dimensions of the first transistor to the second transistor is the inverse of a ratio in the size or dimensions of the second component to the first component.

* * * * *